(12) United States Patent
Basker et al.

(10) Patent No.: US 7,993,999 B2
(45) Date of Patent: Aug. 9, 2011

(54) HIGH-K/METAL GATE CMOS FINFET WITH IMPROVED PFET THRESHOLD VOLTAGE

(75) Inventors: Veeraraghavan S. Basker, Albany, NY (US); Kangguo Cheng, Albany, NY (US); Bruce B. Doris, Albany, NY (US); Johnathan E. Faltermeier, Albany, NY (US); Ali Khakifirooz, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/614,906

(22) Filed: Nov. 9, 2009

(65) Prior Publication Data

US 2011/0108920 A1    May 12, 2011

(51) Int. Cl.
*H01L 21/8238* (2006.01)
(52) U.S. Cl. .................. 438/199; 438/151; 438/216
(58) Field of Classification Search .................. 438/199, 438/151, 216
See application file for complete search history.

(56) References Cited

OTHER PUBLICATIONS

Tezuka, T., et al., "Dislocation-Free Formation of Relaxed Sige-On-Insulator Layers", Applied Physics Letters. vol. 80, No. 19. May 2002. pp. 3560-3562.

*Primary Examiner* — Long Pham
(74) *Attorney, Agent, or Firm* — Tutunjian & Bitetto, P.C.; Louis J. Percello, Esq.

(57) ABSTRACT

A device and method for fabrication of fin devices for an integrated circuit includes forming fin structures in a semiconductor material of a semiconductor device wherein the semiconductor material is exposed on sidewalls of the fin structures. A donor material is epitaxially deposited on the exposed sidewalls of the fin structures. A condensation process is applied to move the donor material through the sidewalls into the semiconductor material such that accommodation of the donor material causes a strain in the semiconductor material of the fin structures. The donor material is removed, and a field effect transistor is formed from the fin structure.

23 Claims, 5 Drawing Sheets

HIGH-K/METAL GATE CMOS FINFET WITH IMPROVED PFET THRESHOLD VOLTAGE

BACKGROUND

1. Technical Field

The present invention relates to semiconductor fabrication and more particularly to high k/metal gate devices and methods for fabricating the same having tuned p-type field effect transistors.

2. Description of the Related Art

In conventional high dielectric constant (high-K) metal gate (HK/MG) fin field effect transistors (FET), a p-type FET (pFET) usually exhibits a threshold voltage (Vt) that is higher than a target value. Forming a thin layer in a channel may be effective to lower planar pFET Vt. However, when a layer is grown on finFET sidewalls, the total fin width increases, degrading electrostatics of the finFET. For example, even 5 nm of growth on each side of a 10 nm fin results in the final width of 20 nm which is unacceptable for 22 nm nodes and beyond. Therefore, there is a need for tuning pMOS finFET without compromising device performance.

SUMMARY

A device and method for fabrication of fin devices for an integrated circuit includes forming fin structures in a semiconductor material of a semiconductor device wherein the semiconductor material is exposed on sidewalls of the fin structures. A donor material is epitaxially deposited on the exposed sidewalls of the fin structures. A condensation process is applied to move the donor material through the sidewalls into the semiconductor material such that accommodation of the donor material causes a strain in the semiconductor material of the fin structures. The donor material is removed, and a field effect transistor is formed from the fin structure.

A method for fabrication of fin devices for an integrated circuit includes forming fin structures in a semiconductor material of a semiconductor device wherein the semiconductor material is exposed on sidewalls of the fin structures; masking a first set of fin structures; epitaxially depositing a donor material on the exposed sidewalls of a second set of fin structures having exposed sidewalls; applying a condensation process to move the donor material through the sidewalls into the semiconductor material for the second set of fin structures such that accommodation of the donor material causes a strain in the semiconductor material of the second set of fin structures; removing the donor material; removing a mask from the first set of fin structures; and forming n-type field effect transistors from the first set of fin structures and p-type field effect transistors from the second set of fin structures.

Another method for fabrication of fin devices for an integrated circuit includes forming fin structures in a silicon layer of a silicon-on-insulator substrate exposing sidewalls of the fin structures; masking a first set of fin structures; epitaxially depositing a Silicon-Germanium (SiGe) on the exposed sidewalls of a second set of fin structures having exposed sidewalls; applying an oxidation condensation process to move Germanium (Ge) through the exposed sidewalls of the second set of fin structures; removing deposited SiGe from the exposed sidewalls; removing a mask from the first set of fin structures; and forming n-type field effect transistors (nFET) from the first set of fin structures and p-type field effect transistors (pFET) from the second set of fin structures such that a complementary metal oxide semiconductor (CMOS) device is fabricated wherein the nFET includes a silicon active area and the pFET include a SiGe active area.

A complementary metal oxide semiconductor (CMOS) device includes a silicon (Si) fin having a gate dielectric and gate conductor formed thereon to form an n-type field effect transistor (nFET); and a silicon germanium (SiGe) fin having a gate dielectric and gate conductor formed thereon to form a complementary p-type field effect transistor (pFET), wherein the Si fin and the SiGe have a same width dimension and have corresponding threshold voltages for proper CMOS functioning.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
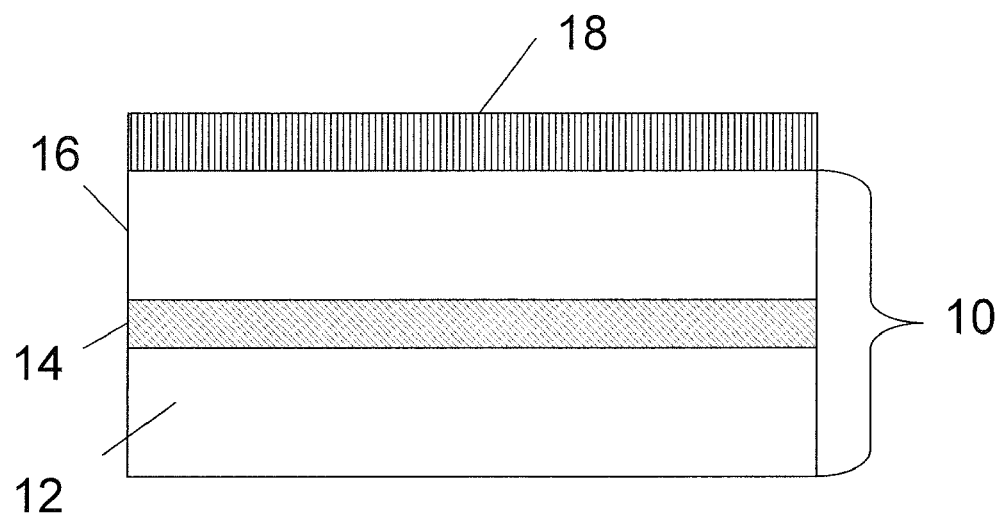
FIG. 1 is a cross-sectional view illustratively showing a device including a semiconductor-on-insulator substrate having a cap layer or dielectric liner formed thereon.

In accordance with the present principles, methods and structures for forming a high dielectric constant (high-k)-metal gate fin field effect transistor (FET) complementary metal oxide semiconductor (CMOS) device is disclosed. The device and method provide a p-type field effect transistor (pFET) within a target threshold voltage. An n-type field effect transistor (nFET) is formed on a fin made from a substrate material. A corresponding pFET is formed on a fin which is processed by pushing or diffusing an element into the substrate material to form a new structure. In one example, the substrate includes silicon which is employed to form the fin for the nFET. In this example, a fin for the pFET includes silicon as well, but Germanium (Ge) is pushed into silicon to form a SiGe fin for the formation of the pFET. The pFET is formed by, e.g., oxidation condensation (to push Ge into a Si fin during oxidation).

In this way, the pFET finFET with a SiGe body achieves a corrected threshold voltage (Vt) since the dimensions of the fin are maintained and an advantageous strain is imparted to the fin. The SiGe and associated strain results from the Ge within a silicon matrix. The strain improves pFET performance because intermixing Ge into Si requires strain relaxation to open up the spaces in the silicon for larger Ge atoms. This is much easier to do in a direction normal to a carrier transport direction. This is an ideal combination: comparable Vt, strain, and a (110) surface for the pFET finFET. In fact in many useful integrated circuit components, such as logic gates and in particular NAND gates, the pFET can be made to especially gain from these advantageous effects.

It should also be understood that the present invention will be described in terms of a given illustrative architecture having a semiconductor-on-insulator (SOI) wafer; however, other architectures, structures, substrate materials and process features and steps may be varied within the scope of the present invention.

The circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a semiconductor-on-insulator substrate (SOI) 10 is shown having a cap layer or dielectric liner 18 formed thereon. The SOI substrate 10 may include a silicon base layer 12 with an insulating layer (e.g., an oxide layer (BOX) layer) 14 and a silicon on oxide layer 16. It should be understood that the substrate 10 may include any suitable material and is not limited to SOI. For example, substrate 10 can be an SOI or bulk substrate that may include Gallium Arsenide, monocrystalline silicon, Germanium, or any other material or combination of materials where the present principles may be applied. In some embodiments, the substrate 10 further comprises other features or structures that are formed on or in the semiconductor substrate in previous process steps.

Dielectric liner 18 may include a dielectric material that enable selective etching of underlying materials (e.g., layer 16). In one embodiment, layer 16 is monocrystalline silicon and liner 18 may include silicon nitride (nitride). Liner 18 is deposited over the substrate 10.

Figure 2:
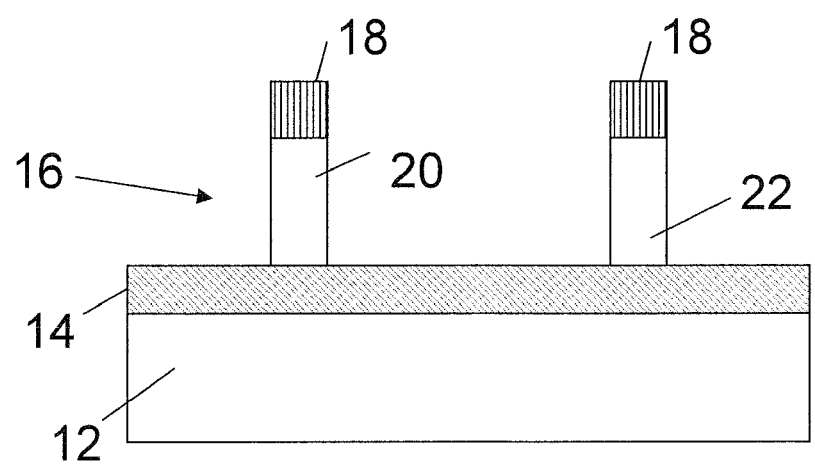
FIG. 2 is a cross-sectional view of the device of FIG. 1 illustratively showing the cap layer patterned and used as a mask to etch silicon to form fins.

Referring to FIG. 2, liner 18 is patterned by, e.g., a lithographic patterning process, which may include steps for forming sub-minimum feature sized fins 20 and 22. These steps may include the formation of mandrels and spacers and employ a sidewall or spacer image transfer (SIT) process to achieve widths that are less than or equal to a minimum feature size achievable by lithography. Other processes may be employed to achieve sub-minimum feature sizes as well.

Once the liner 18 is patterned, an etch process, such as, e.g., a reactive ion etch may be employed to remove a portion of layer 16. Liner 18 acts as an etch mask to open up layer 16. Layer 16 provides a semiconductor material from which FETs may be formed.

In the illustrative structure depicted in FIG. 2, fin 20 will be employed for forming an nFET device while fin 22 will be employed for fanning a pFET device for a CMOS component. It should be understood that the present principles may be applied using technologies other than CMOS. For example, a single pFET may be formed using the present principles.

Figure 3:
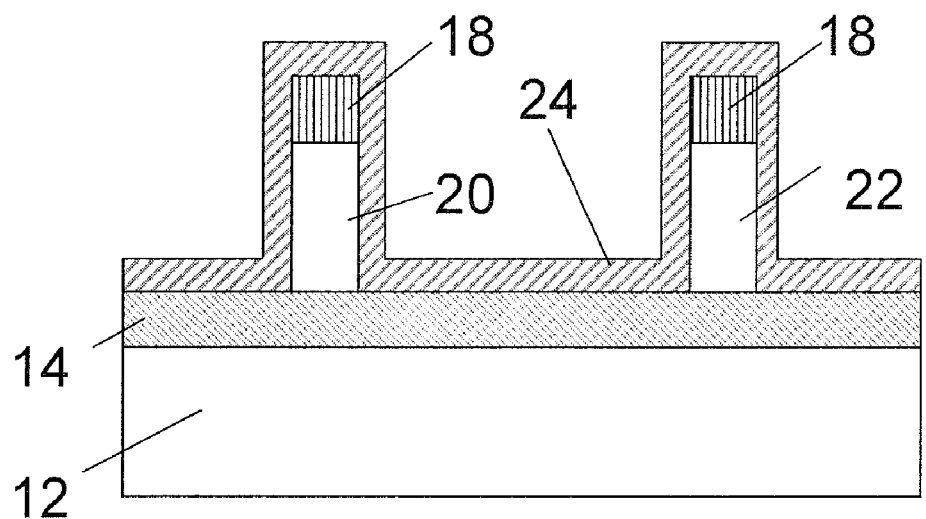
FIG. 3 is a cross-sectional view of the device of FIG. 2 illustratively showing a mask layer conformally deposited over a surface of the fins and oxide layer of the substrate.
Figure 4:
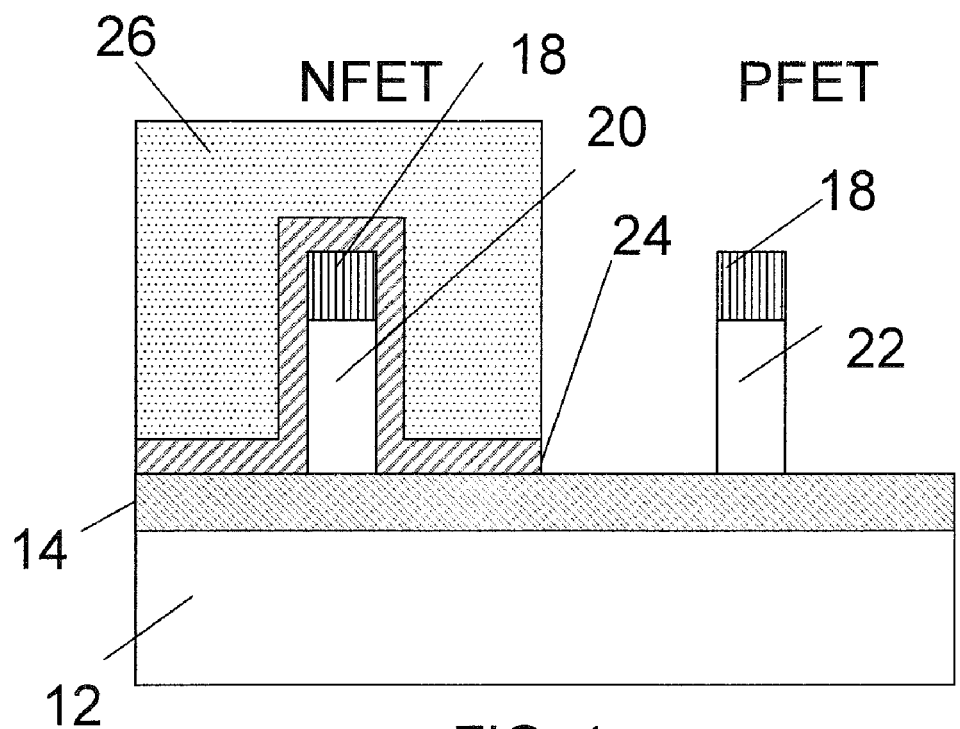
FIG. 4 is a cross-sectional view of the device of FIG. 3 illustratively showing masking of nFET areas to process pFET areas on the device.

Referring to FIGS. 3 and 4, a mask layer 24 is formed over the liner 18, fins 20 and 22 and layer 14. The mask layer 24 may include silicon nitride or any other suitable material. In FIG. 4, the mask layer 24 is patterned using a resist 26 to protect fins 20, which are associated with nFET devices. Resist 26 is developed and removed from areas where pFET devices will be formed (e.g., where fins 22 are provided). An etch process removes the mask layer 24 from the pFET areas. This exposes the sidewalls of the fins 22 for further processing. The resist 26 is then removed from remaining portions of mask layer 24. In this way, the nFET regions remain protected by the mask layer 24.

Figure 5:
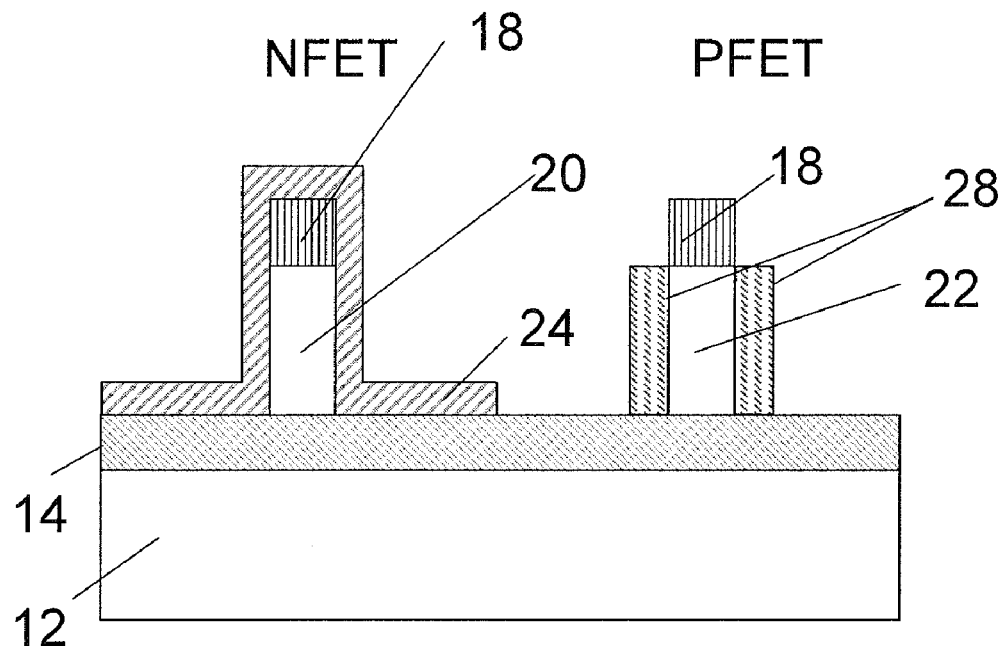
FIG. 5 is a cross-sectional view of the device of FIG. 4 illustratively showing an epitaxial deposition of a donor material on exposed sidewalls of pFET fins.

Referring to FIG. 5, a donor layer 28 is epitaxially deposited on sidewall surfaces of fin 22. It is advantageous to epitaxially grow the donor layer 28 using an epitaxial deposition process to ensure good contact between the donor layer 28 and the sidewalls of fin 22. The epitaxial growth is selective and grows readily on, in this case, exposed silicon surfaces. The donor layer 28 may include a material which when driven into the semiconductor material of fins 22 creates an advantageous strain without adding to the width dimension of the fin 22. In one particularly useful embodiment, fin 22 includes silicon and donor layer 28 includes Silicon-Germanium (SiGe). In other embodiments, donor layer 28 may include pure Ge, Ge mixed with other elements or compounds. The nFET regions remain protected by remaining portions of mask layer 24.

Figure 6:
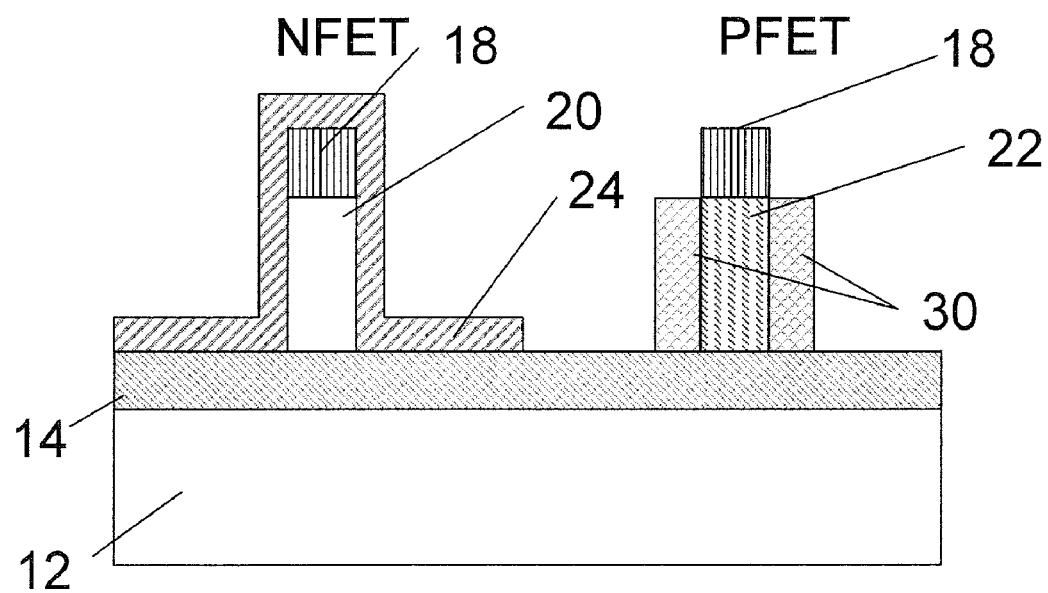
FIG. 6 is a cross-sectional view of the device of FIG. 5 illustratively showing the donor material pushed into the pFET fin by a condensation process.

Referring to FIG. 6, an oxidation condensation process is performed to drive or push donor material into the fin 22. Oxidation condensation is described in T. Tezuka et al., "Dislocation-free formation of relaxed SiGe-on-insulator layers", Applied Physics Letters, Vol. 80, p. 3560-3562, (2002). In one embodiment, if SiGe is employed for the donor layer 28 and fin 22 includes silicon, then Ge is pushed into the Si of fin 22 during the oxidation condensation process. As a result, the composition of fin 22 is altered as donor material is diffused into the fin 22. Donor layer 28 becomes an oxidized layer 30.

Figure 7:
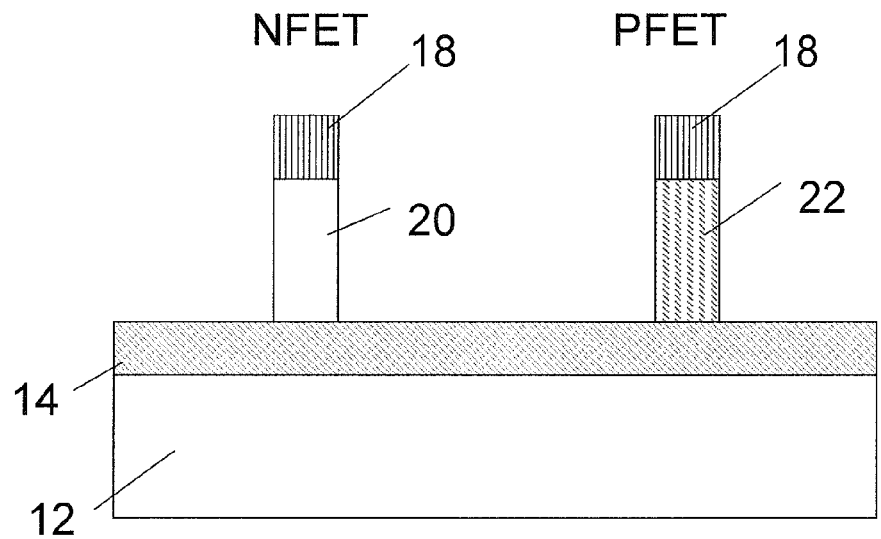
FIG. 7 is a cross-sectional view of the device of FIG. 6 illustratively showing fin structures for the nFET and pFET of a CMOS device.

Referring to FIG. 7, layer 30 is removed from fin 22 and mask layer 24 is removed from fin 20 (nFET area). Standard finFET processing may now be performed to complete nFET and pFET formation.

Figure 8:
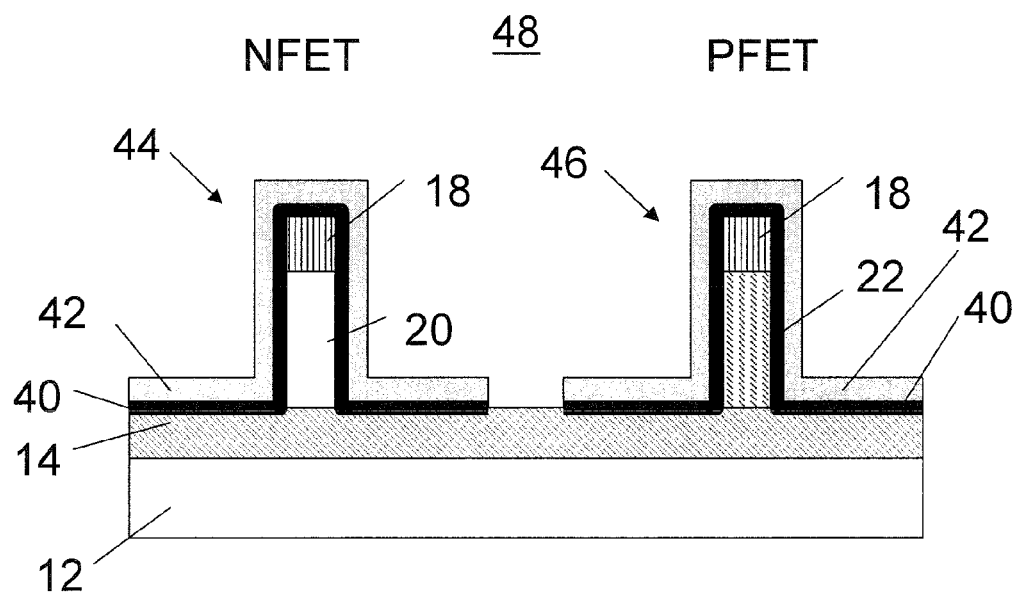
FIG. 8 is a cross-sectional view of the device of FIG. 7 illustratively showing a completed nFET and pFET of the CMOS device.

Referring to FIG. 8, a CMOS device 48 includes an nFET 44 and a pFET 46. The nFET includes fin 20 as its active area to permit conduction along its length (into/out of the page). A high-dielectric constant gate dielectric 40 is formed over the cap layer 18 and fin 20 followed by a gate conductor 42. Likewise, the pFET 46 includes fin 22 as its active area to permit conduction along its length (into/out of the page). Fin 22 includes a different material composition than fin 20. In one embodiment, fin 20 includes silicon while fin 22 includes SiGe. A high-dielectric constant (high-k) gate dielectric 40 is formed over the cap layer 18 and fin 22 followed by a gate conductor 42.

The high-k gate dielectric 40 may include but is not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride.

The gate conductor 42 may include but is not limited to, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate conductor 42 may further comprise dopants that are incorporated during or after deposition.

The gate dielectric 40 and the gate conductor 42 can be deposited by any suitable deposition techniques, existing or later developed, including but not limited to atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of those methods.

In accordance with the present principles, CMOS finFETs 44 and 46 are dimensionally accurate and include a threshold voltage within a specified tolerance. In one embodiment, the nFET 44 is formed on a Si fin 20, and pFET 46 is formed on a SiGe fin 22 using oxidation condensation. Because silicon and silicon-germanium have different band gaps with the silicon body for fin 20 and the SiGe body for fin 22, the correct threshold voltages for both nFET and pFET can be independently achieved with the same gate dielectric 40 and the same gate conductor 42. For example, the absolute value of nFET Vt can be substantially the same as the absolute value of the pFET Vt with the same gate dielectric 40 and the same gate conductor 42. Furthermore, the SiGe includes a strained structure that improves pFET performance because intermixing Ge into Si requires strain relaxation to open up the space for larger Ge atoms. This results in an advantageous combination of a correct threshold voltage, strain, and a (110) surface (e.g., the sidewall surfaces of the fins) for fabricating the pFET finFET.

Figure 9:
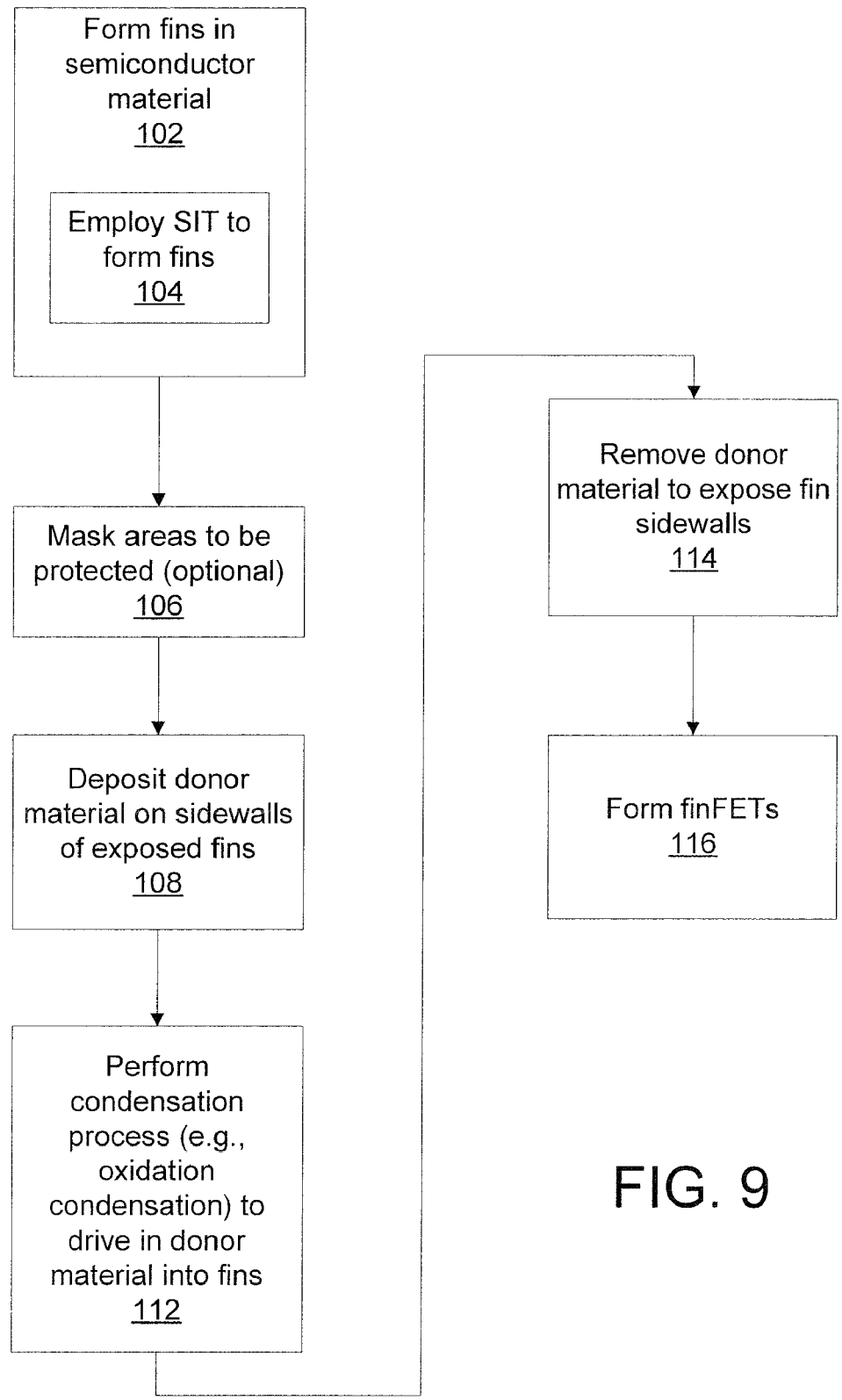
FIG. 9 is a flow diagram showing an illustrative method for fabricating finFETs in accordance with one illustrative embodiment.

Referring to FIG. 9, a flow diagram showing an illustrative method for fabricating finFETs in accordance with one illustrative embodiment. In block 102, fin structures are formed in a semiconductor material of a semiconductor device. The formation of fins includes forming a mask for etching the semiconductor material. The semiconductor material is exposed on sidewalls of the fin structures. In one embodiment, the etch mask for forming fin structures includes employing a spacer image transfer (SIT) process to form the fin structures having a width less than a minimum feature size achievable by lithography in block 104. The process may include depositing a cap layer or dielectric liner, forming mandrels on the liner, forming spacers on the sidewalls of the mandrels, removing the mandrels and employing the spacers as an etch mask to open up the cap layer or dielectric liner.

In block 106, a mask layer may be deposited. The mask layer may be patterned using a resist layer and lithographic processing. The mask layer is etched away from areas that will be further processed, and is maintained in areas that are to remain protected. The areas to be further processed include fin structures with exposed sidewalls. If a CMOS device is being formed with both nFET and pFET devices, then fin structures for the nFETs are masked off during the pFET processing and vice versa, if needed.

In block 108, a donor material is epitaxially deposited on the exposed sidewalls of the fin structures in areas that are not protected by the mask layer. In a particularly useful embodiment, the semiconductor material includes silicon and the donor material includes germanium, silicon germanium or other material including germanium. In block 112, a condensation process is applied to move the donor material through the sidewalls into the semiconductor material such that accommodation of the donor material causes a strain in the semiconductor material of the fin structures. The condensation process preferably includes applying an oxidation condensation process to push the donor material into the semiconductor material. The epitaxial deposition of the donor material is preferably formed on a (110) surface. In this way, the strains introduced by the donor material become beneficial for transistor operation.

In block 114, the donor material is removed from the sidewalls of the fins. The removal of the donor material advantageously maintains a width dimension of the fin structure. This aides in providing the correct threshold voltage for proper operation of the pFET transistor, and if a CMOS device is being fabricated the pFET threshold voltage is comparable to the nFET's threshold voltage to permit proper operation of the CMOS device. In block 116, a field effect transistor or transistors are formed from the fin structures. This may include forming a high-dielectric constant gate dielectric and a gate conductor over the fin structure. Also, other intermediary process steps may be performed, e.g., etching, doping, masking, etc.

Having described preferred embodiments of a method and high-k/metal gate CMOS finFET with improved pFET threshold voltage (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of fin devices for an integrated circuit, comprising:
    forming fin structures in a semiconductor material of a semiconductor device wherein the semiconductor material is exposed on sidewalls of the fin structures;
    epitaxially depositing a donor material on the exposed sidewalls of the fin structures;
    applying a condensation process to move the donor material through the sidewalls into the semiconductor material;
    removing the donor material; and
    forming a field effect transistor from the fin structure.

2. The method as recited in claim 1, wherein the semiconductor material includes silicon and the donor material includes germanium.

3. The method as recited in claim 1, wherein forming fin structures includes employing a spacer image transfer (SIT) process to form the fin structures having a width less than a minimum features size achievable by lithography.

4. The method as recited in claim 1, wherein epitaxially depositing a donor material includes epitaxially depositing silicon germanium.

5. The method as recited in claim 1, wherein applying a condensation process includes applying an oxidation condensation process to push the donor material into the fin structure.

6. The method as recited in claim 1, wherein forming a field effect transistor from the fin structure includes forming a high-dielectric constant gate dielectric and a gate conductor over the fin structure.

7. The method as recited in claim 1, wherein epitaxially depositing a donor material includes depositing the donor material on a (110) surface.

8. The method as recited in claim 1, wherein removing the donor material maintains a width dimension of the fin structure.

9. The method as recited in claim 1, wherein applying a condensation process includes accommodating the donor material in the semiconductor material to cause a strain in the semiconductor material of the fin structures.

10. A method for fabrication of fin devices for an integrated circuit, comprising:
    forming fin structures in a semiconductor material of a semiconductor device wherein the semiconductor material is exposed on sidewalls of the fin structures;
    masking a first set of fin structures;
    epitaxially depositing a donor material on the exposed sidewalls of a second set of fin structures having exposed sidewalls;
    applying a condensation process to move the donor material through the sidewalls into the semiconductor material for the second set of fin structures such that accommodation of the donor material causes a strain in the semiconductor material of the second set of fin structures;
    removing the donor material;
    removing a mask from the first set of fin structures; and
    forming n-type field effect transistors from the first set of fin structures and p-type field effect transistors from the second set of fin structures.

11. The method as recited in claim 10, wherein the semiconductor material includes silicon and the donor material includes germanium.

12. The method as recited in claim 10, wherein forming fin structures includes employing a spacer image transfer (SIT) process to form the fin structures having a width less than a minimum features size achievable by lithography.

13. The method as recited in claim 10, wherein epitaxially depositing a donor material includes epitaxially depositing silicon germanium.

14. The method as recited in claim 10, wherein applying a condensation process includes applying an oxidation condensation process to push the donor material into the second set of fin structures.

15. The method as recited in claim 10, wherein forming n-type field effect transistors from the first set of fin structures and p-type field effect transistors from the second set of fin structures includes forming a high-dielectric constant gate dielectric and a gate conductor over the fin structures.

16. The method as recited in claim 10, wherein epitaxially depositing a donor material includes depositing the donor material on a (110) surface.

17. The method as recited in claim 10, wherein removing the donor material maintains a width dimension of the fin structures.

18. The method as recited in claim 10, wherein the p-type field effect transistor meets a suitable threshold voltage to function with the n-type field effect transistor as a complementary metal oxide semiconductor (CMOS) device.

19. A method for fabrication of fin devices for an integrated circuit, comprising:
    forming fin structures in a silicon layer of a silicon-on-insulator substrate exposing sidewalls of the fin structures;
    masking a first set of fin structures;
    epitaxially depositing a Silicon-Germanium (SiGe) on the exposed sidewalls of a second set of fin structures having exposed sidewalls;
    applying an oxidation condensation process to move Germanium (Ge) through the exposed sidewalls of the second set of fin structures;
    removing deposited SiGe from the exposed sidewalls;
    removing a mask from the first set of fin structures; and
    forming n-type field effect transistors (nFET) from the first set of fin structures and p-type field effect transistors (p-FET) from the second set of fin structures such that a complementary metal oxide semiconductor (CMOS) device is fabricated wherein the n-FET includes a silicon active area and the p-FET include a SiGe active area.

20. The method as recited in claim 19, wherein forming fin structures includes employing a spacer image transfer (SIT) process to form the fin structures having a width less than a minimum features size achievable by lithography.

21. The method as recited in claim 19, wherein forming n-type field effect transistors from the first set of fin structures and p-type field effect transistors from the second set of fin structures includes forming a high-dielectric constant gate dielectric and a gate conductor over the fin structures.

22. The method as recited in claim 19, wherein epitaxially depositing includes depositing the SiGe on a surface normal to a channel direction of the p-type field effect transistor.

23. The method as recited in claim 19, wherein removing the donor material maintains a width dimension of the fin structures, wherein the p-type field effect transistor meets a suitable threshold voltage to function with the n-type field effect transistor as the CMOS device.

* * * * *